United States Patent [19]

Venema

[11] Patent Number: 4,633,168

[45] Date of Patent: Dec. 30, 1986

[54] MEASURING SYSTEM FOR DETERMINING THE REACTANCE RATIO OF A PAIR OF REACTIVE DEVICES

[75] Inventor: Harry J. Venema, Wheaton, Ill.

[73] Assignee: Borg-Warner Corporation, Chicago, Ill.

[21] Appl. No.: 676,981

[22] Filed: Nov. 30, 1984

[51] Int. Cl.$^4$ .............................................. G01R 27/26
[52] U.S. Cl. ................................. 324/60 CD; 307/110
[58] Field of Search ............ 324/60 CD, 60 C, 60 R, 324/61 R, 61 QS, 61 QC, 140 D; 73/716, 718, 724; 340/530; 307/109, 110, 246, 494, 498, 517, 491; 331/111; 328/161, 143, 158

[56] References Cited

U.S. PATENT DOCUMENTS

| | | | |
|---|---|---|---|
| 3,761,805 | 9/1973 | Dornberger | 324/60 C |
| 3,824,459 | 7/1974 | Uchida | 324/60 CD |
| 3,886,447 | 5/1975 | Tanaka | 324/60 CD |
| 4,166,974 | 9/1979 | Vermeers | 324/60 CD |
| 4,283,676 | 8/1981 | Shaw | 324/60 C |
| 4,404,481 | 9/1983 | Ide et al. | 307/491 |

Primary Examiner—Reinhard J. Eisenzopf
Assistant Examiner—Jack B. Harvey
Attorney, Agent, or Firm—James E. Tracy

[57] ABSTRACT

By simultaneously charging a pair of capacitors from the same low voltage level to the same high reference voltage level, the two charge time durations will be functions of and will be proportional to the capacitances of the two capacitors. A comparison of those charge time durations will thus provide an indication of the ratio of the capacitances of the two capacitors. This is achieved by including, in the measuring system, an oscillating circuit whose frequency is determined by the capacitance of one of the capacitors. A periodically-recurring rectangular wave is then developed having pulse components with pulse widths determined by the capacitance of the other capacitor, the frequency of the rectangular wave being equal to the oscillating frequency. The duty cycle of the rectangular wave is therefore proportional to and respresents the ratio of the capacitances of the capacitors. By averaging the rectangular wave in a low-pass filter, an output signal is produced having an amplitude which is proportional to and represents the capacitance ratio.

1 Claim, 2 Drawing Figures

4,633,168

MEASURING SYSTEM FOR DETERMINING THE REACTANCE RATIO OF A PAIR OF REACTIVE DEVICES

BACKGROUND OF THE INVENTION

This invention relates in general to a measuring system for determining the ratio of a pair of reactances and in particular to a precision measuring system for comparing the electrical sizes of two capacitors to determine their ratio with a high degree of accuracy.

A variety of arrangments have been developed for measuring the capacitance of capacitors. Most of these arrangements, however, require constant operating characteristics, such as a constant supply voltage, operating temperature, etc., to obtain accurate results. In contrast, the measuring system of the present invention achieves very precise measurements at all times and is immune to any variations in operating characteristics. Moreover, this is accomplished by means of a relatively simple and inexpensive circuit arrangement. While the measuring system of the invention determines the ratio of two capacitors, it can easily be used to determine an unknown capacitance when the other capacitance is known.

SUMMARY OF THE INVENTION

The invention provides, in accordance with one of its aspects, a measuring system for comparing first and second capacitors to determine the ratio of their capacitances. The system comprises means for simultaneously charging the first and second capacitors, starting at time $t_o$, from the same relatively low voltage level to the same relatively high reference voltage level. The first capacitor has a charge time constant shorter than that of the second capacitor and charges to the reference voltage level, at time $t_1$, before the second capacitor reaches the reference voltage level at the later time $t_2$, the time duration from $t_0$ to $t_1$ thereby being a function of the capacitance of the first capacitor while the time duration from $t_0$ to $t_2$ is a function of the capacitance of the second capacitor. The measuring system also comprises means for effectively comparing the two time durations and for producing, from the comparison, an output signal representing the ratio of the capacitances of the first and second capacitors.

DESCRIPTION OF THE DRAWINGS

The features of the invention which are believed to be novel are set forth with particularity in the appended claims. The invention may best be understood, however, by reference to the following description in conjunction with the accompanying drawings in which:

DESCRIPTION OF THE ILLUSTRATED EMBODIMENT

Capacitors $C_1$ and $C_2$ may take a variety of different forms. The capacitance of one or both may be unknown. In either event, the measuring system will provide an output signal bearing information which indicates the ratio of the two capacitances. As one example of capacitors $C_1$ and $C_2$, they may both be included in a capacitive ceramic pressure sensor manufactured by Borg-Warner Corporation under the designation 358-522. As the pressure changes, the capacitance of one of the capacitors increases while the capacitance of the other capacitor decreases. In other words, the ratio of the capacitances varies with pressure. Hence, a measurement of the ratio will indicate the sensed pressure.

Figure 1:
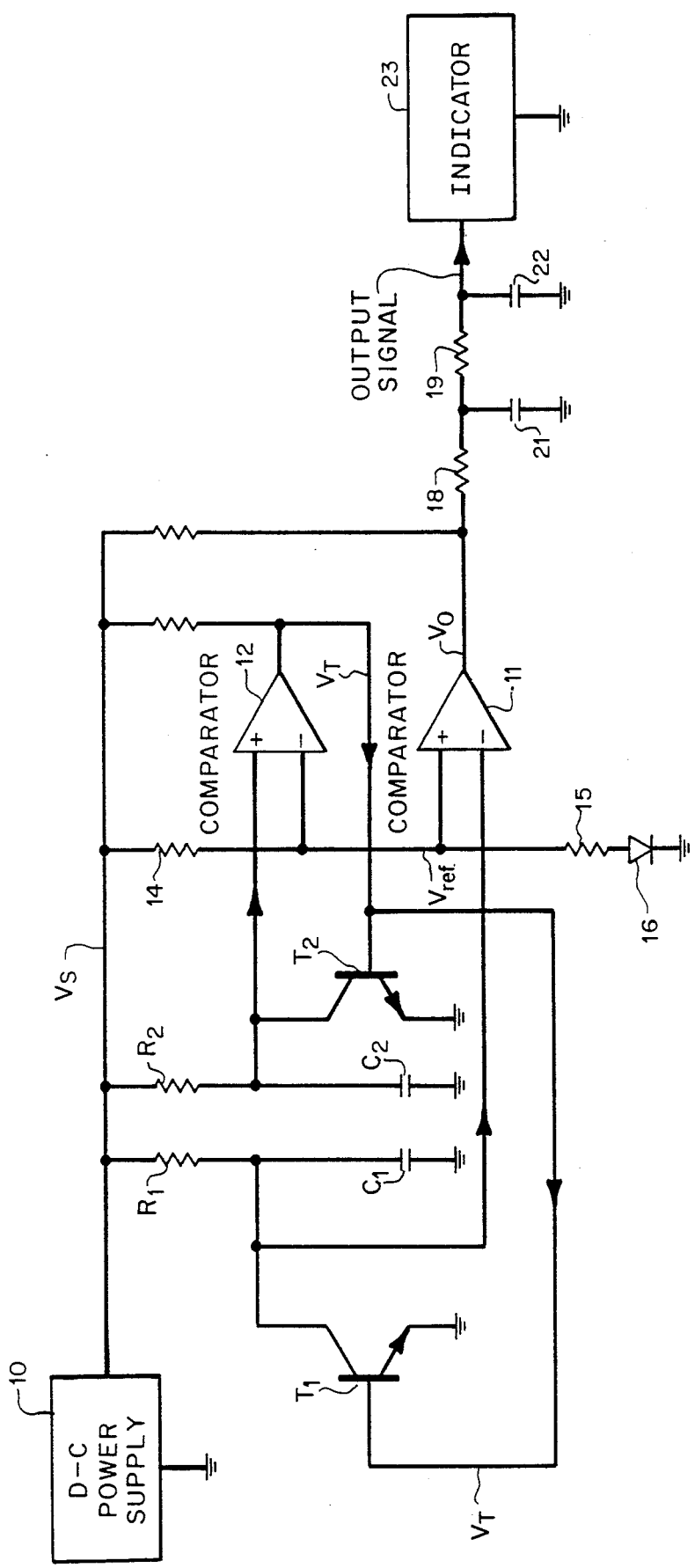
FIG. 1 schematically illustrates a measuring system, constructed in accordance with one embodiment of the invention, for determining the ratio of the capacitances of a pair of capacitors $C_1$ and $C_2$; and, FIG. 2 depicts various signal waveforms that will be helpful in understanding the operation of the measuring system.

As will be apparent, the measuring system of FIG. 1 includes an oscillating circuit so that the system will operate in cyclic fashion. At time $t_0$ (see FIG. 2) transistor $T_1$ will be turned on, by the first-occurring triggering pulse in voltage waveform $V_T$, and capacitor $C_1$ will rapidly discharge from a positive voltage, nearing the voltage $V_s$ of the d-c power supply 10, to a very small positive voltage as determined by the very little voltage drop across transistor $T_1$. Hence, capacitor $C_1$ discharges to essentially zero volts as indicated by the waveform $V_{c1}$ which shows the voltage across capacitor $C_1$. At the time $t_0$ when capacitor $C_1$ discharges to zero, the voltage at the negative input of comparator 11 will become less than (namely negative relative to) that at the comparator's positive input, to which is applied a d-c reference voltage $V_{ref}$ produced by the voltage divider, comprising resistors 14 and 15 and diode 16, which in turn is coupled across d-c power supply 10. The voltage drop of diode 16 is equal to that introduced by transistors $T_1$ and $T_2$ when they conduct, the transistors being substantially identical in construction. In this way, the voltage drops across the transistors are effectively compensated by the voltage drop across diode 16. Providing identical transistors is easiest achieved by forming the transistors, along with most of the other elements shown in FIG. 1, on the same monolithic chip. Preferably, resistors 14 and 15 are of equal value so that the reference voltage $V_{ref}$, at the circuit junction of those resistors, will be essentially one-half of the voltage $V_s$. In response to the lower voltage at the negative input of comparator 11 at time $t_0$, the output voltage of the comparator abruptly switches from its low level, or zero volts, to its high level, as indicated by voltage waveform $V_o$ in FIG. 2.

At the same time $t_0$ that capacitor $C_1$ discharges to a relatively low voltage, namely to zero volts, the first-occurring triggering pulse in voltage waveform $V_T$ also renders transistor $T_2$ conductive to cause capacitor $C_2$ to rapidly discharge from the d-c reference voltage $V_{ref}$ to the same low voltage or zero level, as shown by voltage waveform $V_{c2}$. That negative-going voltage on capacitor $C_2$ at time $t_0$ establishes the positive input of comparator 12 at a lower potential level than the comparator's negative input, to which is applied the d-c reference voltage $V_{ref}$. As a result, the output voltage of comparator 12 abruptly switches to its low, or zero volts, level as shown by waveform $V_T$. Actually, switching of comparator 12 to its low output voltage level in response to discharging of capacitor $C_2$ is what causes the triggering pulse to terminate. When that termination occurs, both transistors $T_1$ and $T_2$ will be turned off. There is sufficient delay in the circuit to allow capacitors $C_1$ and $C_2$ to fully discharge to the low voltage or zero level before the transistors are cut off.

Figure 2:
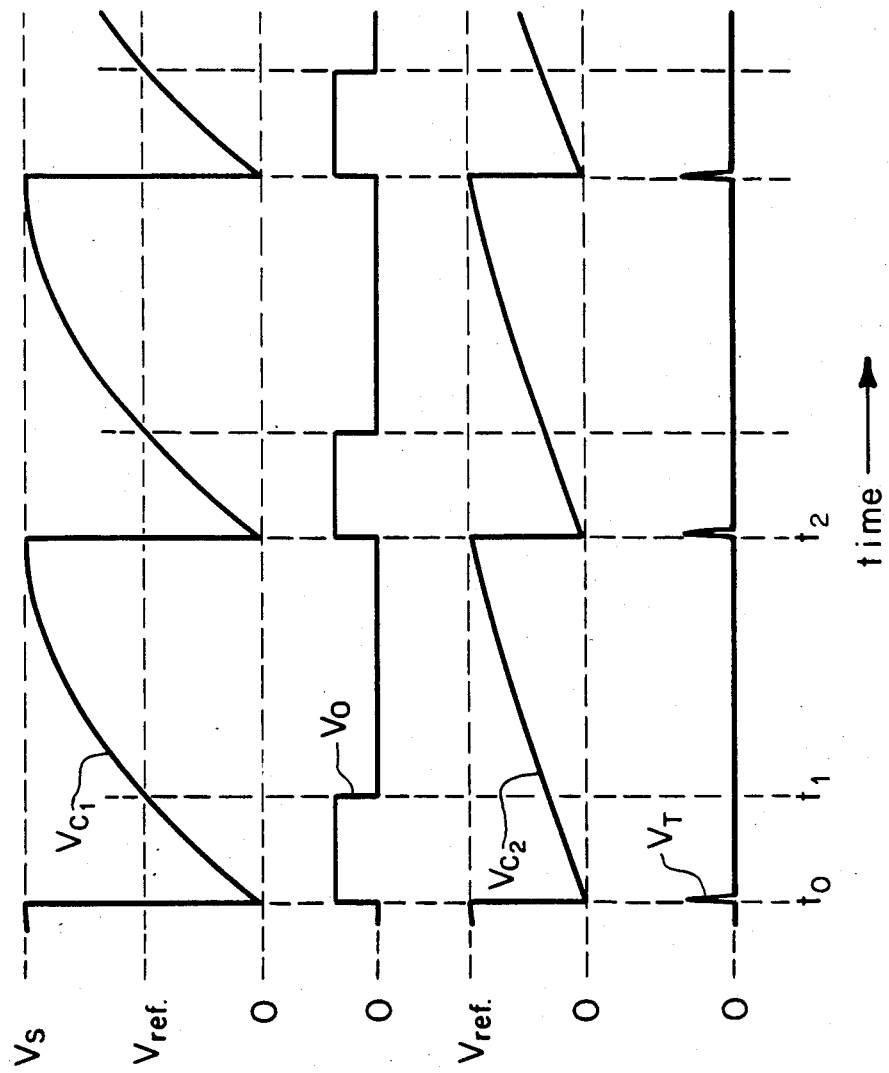

After the occurrence of the first triggering pulse of waveform $V_T$, capacitors $C_1$ and $C_2$ will both begin to simultaneously, and slowly, charge from zero volts toward the output voltage $V_s$ of d-c power supply 10, as shown by waveforms $V_{c1}$ and $V_{c2}$. Capacitor $C_1$ will charge through series-connected resistor $R_1$, while capacitor $C_2$ charges through series-connected resistor $R_2$. The system is designed so that regardless of the particular capacitances of the capacitors at any one time, and those values may vary over a relatively wide range in some applications of the invention, the charge time constant of capacitor $C_1$ will always be shorter than that of capacitor $C_2$. In this way, capacitor $C_1$ will charge to the reference voltage $V_{ref}$, at time $t_1$, before the capacitor $C_2$ reaches the reference voltage level at the later time $t_2$ as illustrated in FIG. 2. When the voltage $V_{c1}$ across capacitor $C_1$ increases to voltage $V_{ref}$ at time $t_1$, the voltage at the negative input of comparator 11 becomes greater than (or positive relative to) that at the comparator's negative input, whereupon the output switches from its high level to its low level, as shown in voltage waveform $V_o$ at time $t_1$. Subsequent to that time capacitor $C_1$ will continue to charge toward the power supply voltage $V_s$.

When capacitor $C_2$ charges to the reference voltage level $V_{ref}$, at the much later time $t_2$, the output of comparator 12 will be switched from its low level to its high level to produce the second-occurring triggering pulse in waveform $V_T$. This pulse turns on transistors $T_1$ and $T_2$ and causes capacitors $C_1$ and $C_2$ to once again quickly discharge to zero volts to start another cycle of operation. At this time $t_2$, comparator 11 is also switched and output $V_o$ experiences a positive-going amplitude excursion. As soon as capacitor $C_2$ discharges at time $t_2$, comparator 12 immediately switches back to its low output level to terminate the triggering pulse. It is thus apparent that the measuring system oscillates to periodically repeat the waveshape of voltage $V_o$ during the time interval from $t_0$ to $t_2$. In other words, the measuring system produces, at the output of comparator 11, a periodically-recurring rectangular shaped signal whose period is equal to the time duration from $t_0$ to $t_2$. The oscillating frequency, of course, is not critical. In one applicaton of the invention the frequency was around 20 kilohertz.

The time duration from $t_0$ to $t_1$, required for capacitor $C_1$ to charge to the reference voltage level $V_{ref}$, is a function of the capacitance of that capacitor. Similarly, the time duration from $t_0$ to $t_2$ is a function of the capacitance of capacitor $C_2$. Since the two capacitors simultaneously charge from the same low voltage level (zero volts) to the same reference voltage level and then simultaneously discharge back to the low voltage level, it can easily be proved that the ratio of the time duration from $t_0$ to $t_1$ compared to the time duration from $t_0$ to $t_2$ is equal to:

$R_1C_1/R_2C_2$

Hence, the duty cycle of the rectangular wave $V_o$ is proportional to and represents the ratio of the capacitances of capacitors $C_1$ and $C_2$. By effectively comparing the two time durations from $t_0$ to $t_1$ and $t_0$ to $t_2$, namely by measuring the duty cycle, an output signal may be developed which represents the capacitance ratio. This is accomplished in the illustrated embodiment by means of an averaging circuit in the form of a low-pass filter comprising resistors 18 and 19 and capacitors 21 and 22. The averaging circuit 18–22 produces an output signal having an amplitude equal to the average voltage of voltage waveform $V_o$, which of course is directly proportional to the duty cycle of waveform $V_o$ and thereby represents the capacitance ratio of capacitors $C_1$ and $C_2$ with a high degree of accuracy. Any time that ratio changes, the amplitude of the output signal varies.

The output signal may be utilized in a variety of different ways. For simplicity it is shown applied to an indicator 23 which responds to the output signal to provide an indication or display of the value of the capacitance ratio. In most applications of the invention, however, the output signal would probably be used to control the operation of some system in response to the capacitance ratio. For example, when capacitors $C_1$ and $C_2$ are incorporated in a pressure sensor, as suggested previously, the capacitance ratio would vary as the sensed pressure changes. Since the amplitude of the output signal would now represent the sensed pressure, the signal could be employed to control a system in response to pressure, such as controlling the operation of an internal combustion engine in response to sensed intake manifold pressure.

If the capacitance of one of the capacitors $C_1$ and $C_2$ is known and it is desired to determine the size of the other capacitor, the output signal will be directly proportional to the capacitance of capacitor $C_1$ when capacitor $C_2$ is known, whereas the output signal will be inversely proportional to the capacitance of capacitor $C_2$ when capacitor $C_1$ is known.

It is to be appreciated that in the measuring system of the invention the duty cycle is immune to variations in operating characteristics, such as supply voltage variations, temperature changes, etc. If the supply voltage $V_s$ changes, the reference voltage $V_{ref}$ will vary in step and will be linearly proportional to the supply voltage whatever it is. The averaging circuit 18–22 will cancel out any undesired variations in the circuit elements, such as changes in resistors 14 and 15 which would occur in the event that they have different temperature coefficients.

Also to be fully understood is the fact that the measuring system is ratiometric in that for fixed capacitance values, the amplitude of the output signal will always be a fixed ratio of the supply voltage.

Moreover, it should be realized that the invention, in a broad sense, simultaneously stores energy in a pair of reactive devices at different storage rates such that one of the reactive devices will store energy in a given amount proportional to the reactance of the device before the other reactive device stores a given amount of energy proportional to its reactance. By comparing the two time durations required to store the two different energy amounts, it is possible to determine the ratio of the reactances of the two reactive devices. Hence, the invention could be employed to measure the inductance ratio of a pair of inductors.

While particular embodiments of the invention have been described, modifications may be made, and it is intended in the appended claims to cover all such modifications as may fall within the true spirit and scope of the invention.

I claim:

1. A measuring system for comparing first and second unknown capacitors to determine the ratio of their capacitances, comprising:

means for simultaneously, and slowly, charging the first and second unknown capacitors, starting at time $t_0$, from the same relatively low voltage level to the same relatively high reference voltage level $V_{ref}$, each of the first and second capacitors being charged through a series-connected resistor toward the output voltage of a d-c power supply which output voltage is substantially greater than the reference voltage $V_{ref}$, the reference voltage being produced by a voltage divider connected across the d-c power supply and thereby being directly proportional to, and varying in step with variations of, the power supply voltage, the first capacitor having a charge time constant, determined by its capacitance and the resistance of its series-connected resistor, substantially shorter than the charge time constant of the second capacitor, which is determined by its capacitance and its series-connected resistance, so that the first capacitor charges to the reference voltage $V_{ref}$, at time $t_1$, long before the second capacitor reaches the reference voltage at the later time $t_2$, the time duration from $t_0$ to $t_1$ thereby being a function of the capacitance of the first capacitor while the time duration from $t_0$ to $t_2$ is a function of the capacitance of the second capacitor;

means for simultaneous, and rapidly, discharging the first and second capacitors, at time $t_2$, back to the low voltage level by turning on a pair of substantially identical first and second transistors each of which is shunt-connected across a respective one of the first and second capacitors, the second capacitor, its shunt-connected second transistor and its series-connected resistor being included in an oscillating circuit which produces periodically-recurring triggering pulses to turn said first and second transistors on to effect rapid discharging of the first and second capacitors, the triggering pulses being produced in the oscillating circuit by a voltage comparator which compares the voltage across the second capacitor to the reference voltage $V_{ref}$, the period of the triggering pulses thereby being a function of the capacitance of the second capacitor and being equal to the time duration from $t_0$ to $t_2$;

another voltage comparator which compares the voltage across the first capacitor to the reference voltage $V_{ref}$ to detect when the first capacitor charges to the reference voltage, thereby to determine the time duration from $t_0$ to $t_1$, said other voltage comparator producing a periodically-recurring rectangular wave whose duty cycle represents the ratio of the capacitances of the first and second unknown capacitors, the rectangular wave having pulse components each of which has a pulse width equal to the time duration from $t_0$ to $t_1$ while the period of the rectangular wave is equal to the time duration from $t_0$ to $t_2$;

an averaging circuit for producing, from said periodically-recurring rectangular wave, an output signal having an amplitude which is proportional to the ratio of the capacitances of the first and second unknown capacitors;

and indicating means, responsive to said output signal, for providing an indication of the value of the capacitance ratio of the first and second unknown capacitors.

* * * * *